United States Patent [19]

Fripp et al.

[11] 4,341,012
[45] Jul. 27, 1982

[54] PYROELECTRIC DETECTOR ARRAYS

[75] Inventors: Archibald L. Fripp, Williamsburg; James B. Robertson; Roger A. Breckenridge, both of Yorktown, all of Va.

[73] Assignee: The United States of America as represented by the Administrator, National Aeronautics and Space Administration, Washington, D.C.

[21] Appl. No.: 191,748

[22] Filed: Sep. 29, 1980

[51] Int. Cl.³ .......................................... H01C 17/06
[52] U.S. Cl. .................................... 29/620; 29/576 J; 29/576 S; 250/332; 250/370
[58] Field of Search ................ 29/620, 576 J, 576 S, 29/610 R, 884, 876; 250/21 J, 332, 334, 338, 370

[56] References Cited

U.S. PATENT DOCUMENTS

| | | | |
|---|---|---|---|
| 3,480,777 | 11/1969 | Astheimer | 73/355 |
| 3,961,998 | 6/1976 | Scharnhorst | 250/211 J |
| 3,989,946 | 11/1976 | Chapman et al. | 250/332 |
| 4,011,916 | 12/1977 | King | 250/332 |
| 4,039,116 | 8/1977 | Choffin | 228/123 |
| 4,039,833 | 8/1977 | Thom | 250/332 |
| 4,063,268 | 12/1977 | King | 250/332 |
| 4,079,507 | 3/1978 | King | 250/332 |
| 4,262,198 | 4/1981 | Gupta | 250/332 |
| 4,286,278 | 8/1981 | Lorenze et al. | 250/332 |

Primary Examiner—Leon Gilden
Attorney, Agent, or Firm—William H. King; John R. Manning; Howard J. Osborn

[57] ABSTRACT

A pyroelectric detector array and the method for making it. A series of holes 13 formed through a silicon dioxide layer 12 on the surface of a silicon substrate 11 forms the mounting fixture for the pyroelectric detector array. A series of nontouching strips of indium 14 are formed around the holes 13 to make contact with the backside electrodes 16 and form the output terminals for individual detectors. A pyroelectric detector strip 15 with front and back electrodes 17 and 16, respectively, is mounted over the strips 14. Biasing resistors 18 are formed on the surface of the silicon dioxide layer and connected to the strips 14. A metallized pad 19 formed on the surface of layer 12 is connected to each of the biasing resistors 18 and to the film 17 to provide the ground for the pyroelectric detector array.

7 Claims, 3 Drawing Figures

PYROELECTRIC DETECTOR ARRAYS

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The invention relates generally to pyroelectric detectors and more specifically concerns pyroelectric detector arrays fabricated in a manner compatible with silicon device technology.

When constructing a pyroelectric detector array on a substrate it is desirable to mount the pyroelectric detector elements so that they are as close to "free hanging" as possible. This minimizes thermal conductance between the elements and the substrate thereby improving responsivity. Previously, pyroelectric detector arrays have been produced by cementing a pyroelectric chip to a ceramic substrate and wire bonding the individual detector elements to the load resistors and to FET's which are also cemented to the ceramic substrate. This method requires a minimum of three wire bonds per element.

The disadvantages of previous pyroelectric detector arrays are that they require several wire bonds per element, and they are cemented to the substrate creating thermal contact over one entire side thereby decreasing respnsivity.

It is therefore the primary object of this invention to make the pyroelectric detector elements in any array as close to "free hanging" as possible in order to minimize thermal conductance thereby, improving the responsivity of the detector elements.

It is another object of this invention to provide pyroelectric detector arrays which do not require several wire bonds per element.

Other objects and advantages of this invention will become apparent hereinafter in the specification and drawings.

SUMMARY OF THE INVENTION

The invention is pyroelectric detector arrays fabricated by forming the mounting fixture for the pyroelectric detector elements and then attaching the detector elements to and depositing the biasing resistors for these detector elements on the mounting fixture. These techniques are within standard silicon integrated circuit technology.

The mounting fixture is fabricated by thermally growing and/or pyrolytically depositing a layer of silicon dioxide on a silicon substrate. Then a series of holes are etched in the silicon dioxide layer through a photolithographically formed mask.

A pyroelectric detector strip is mounted over the series of holes by coating and patterning, with photolythography and metal etching, a soft metal such as indium on both the silicon dioxide layer and the pyroelectric detector strip. These two materials are then cold welded together. The ground connection for the detectors is formed by depositing, patterning, and etching a thin film such as gold or chromium on the upper surface of the pyroelectric detector strip and then wire bonding the thin film to a metallized pad on the silicon dioxide surface. Biasing resistors are formed by the pyrolytic decomposition of silane gas to deposit polycrystalline silicon on the surface of the silicon dioxide.

DETAILED DESCRIPTION OF THE INVENTION

Figure 1:
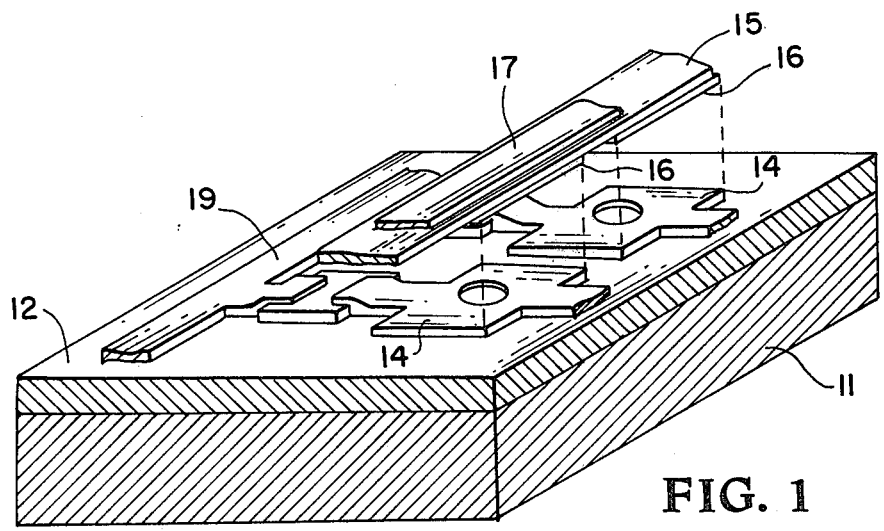
FIG. 1 is a perspective drawing of the invention.
Figure 2:
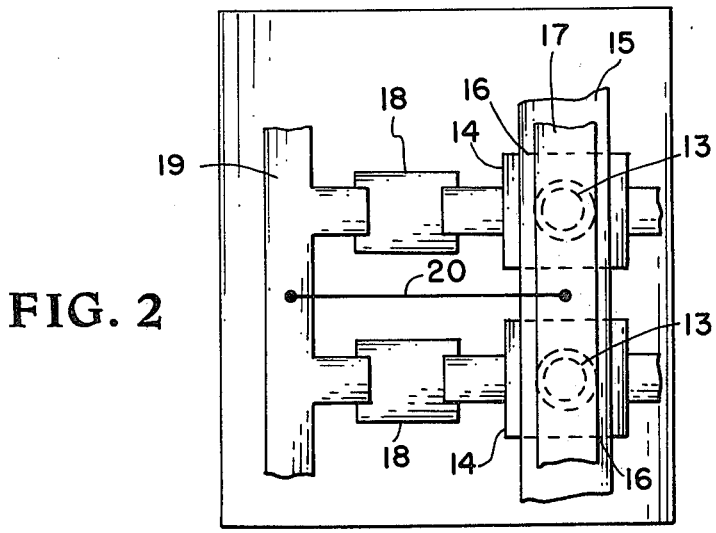
FIG. 2 is a top view of FIG. 1.
Figure 3:
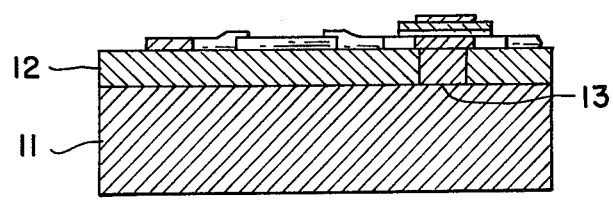
FIG. 3 is an end view of FIG. 1.

Turning now to the embodiment of the invention selected for illustration in the drawings, the number 11 designates a silicon substrate. A silicon dioxide layer 12 is formed on substrate 11 by any conventional means such as for example, thermally grown and/or pyrolythically deposited. A series of holes 13 are formed in the silicon dioxide layer 12 by etching through a photolythographically formed mask. The substrate 11, layer 12, and the series of holes 13 form the mounting fixture for a pyroelectric detector array.

A series of nontouching strips 14 of a soft metal such as indium is formed around the holes 13 by coating and patterning with photolythography and metal etching. These strips 14 are the output terminals for pyroelectric detectors in the array. A pyroelectric detector strip 15 has a series of strips 16 of a soft metal such as indium deposited on one of its sides to correspond to the strips 14 deposited on the silicon dioxide layer 12. A thin film 17 such as gold or chromium is formed by depositing, patterning and etching on the upper surface of the pyroelectric detector strip 15. The detector strip 15 is then mounted over the holes 13 by cold welding the strips 14 and 16 together.

A series of biasing resistors 18 are formed on the surface of silicon dioxide layer 12 by the pyrolythic decomposition of silane gas to deposit polycrystalline silicon on the surface. Undoped polycrystalline silicon has a resistivity of approximately $2 \times 10^5$ ohms per centimeter. Hence, by using standard silicon device dimensions, a biasing resistor as large as $1 \times 10^{12}$ ohms can be integrated on a chip. A metallized pad such as aluminum is formed on the surface of layer 12 by conventional means. The biasing resistors 18 are each formed on the surface of layer 12 in contact with a corresponding strip 14 and in contact with metallized pad 19. Film 17 is wire bonded to metallized pad 19 by means of a wire 20 to form a common ground for the pyroelectric detector array.

In the pyroelectric detector array described above the only thermal conductance from the different detector elements to the substrate is through strips 14 surrounding the the holes to the silicon dioxide layers.

The advantages of this invention over prior art devices are numerous: it provides pyrodetector arrays at lower cost, better image registration, improved device reliability, and quasi-free mounting for improved responsivity.

What is claimed as new and desired to be secured by Letters Patent of the United States is:

1. A method for mounting a pyroelectric detector array on silicon integrated circuits comprising the steps of:
    forming a silicon dioxide layer on a silicon substrate;
    forming a series of holes in said silicon dioxide layer;
    coating said silicon dioxide layer with a series of nontouching strips of soft metal with each strip being over and around one of said holes, wherein each strip is the output terminal for a pyroelectric detector;

coating one side of a pyroelectric detector strip with a series of strips of soft metal;

mounting said pyroelectric detector strip over said series of holes such that said series of strips of soft metal on said detector strips are in contact with said series of strips on said silicon dioxide layers; and forming a metal layer on the side opposite said one side of said pyroelectric detector strip to provide a ground connection for the pyroelectric detector array.

2. A method for mounting a pyroelectric detector array according to claim 1 wherein said step of mounting said pyroelectric detector strip over said series of holes comprises the step of cold welding said series of strips of soft metal on said detector strip to said series of strips on said silicon dioxide layer.

3. A method for mounting a pyroelectric detector array according to claim 1 wherein said step of forming a series of holes in said silicon dioxide layer is performed by etching through a photolythographically formed mask.

4. A method for mounting a pyroelectric detector array according to claim 1 wherein said soft metal is indium.

5. A method for mounting a pyroelectric detector array according to claim 1 including the steps of forming a series of biasing resistors on the surface of said silicon dioxide layer with each having one side in electrical contact with a corresponding one of said series of non-touching strips of soft metal on the surface of said silicon dioxide layer and a metallized pad on the silicon dioxide surface in electrical contact with the other side of each of said biasing resistors.

6. A method for mounting a pyroelectric detector array according to claim 5 wherein said biasing resistors are formed by the pyrolytic decomposition of silane gas to deposit polycrystalline silicon on the surface of the silicon dioxide.

7. A method for mounting a pyroelectric detector array according to claim 5 including the step of wire bonding said metal layer on one side of said pyroelectric detector strip to said metallized pad.

* * * * *